(12) United States Patent
Fukami et al.

(10) Patent No.: US 8,531,170 B2
(45) Date of Patent: Sep. 10, 2013

(54) SEMICONDUCTOR DEVICE

(75) Inventors: Ikuo Fukami, Kanagawa (JP); Masaji Nakano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 343 days.

(21) Appl. No.: 13/037,993

(22) Filed: Mar. 1, 2011

(65) Prior Publication Data

US 2011/0215783 A1      Sep. 8, 2011

(30) Foreign Application Priority Data

Mar. 2, 2010   (JP) .................................. 2010-045583

(51) Int. Cl.
    *G05F 3/16*      (2006.01)
(52) U.S. Cl.
    USPC ......................................................... 323/313
(58) Field of Classification Search
    USPC ................. 323/273, 274, 275–277, 279, 280,
                                323/313; 361/56, 58, 93.7, 101
    See application file for complete search history.

(56) References Cited

U.S. PATENT DOCUMENTS

| | | | | |
|---|---|---|---|---|
| 4,378,580 A | * | 3/1983 | Stich | 361/91.3 |
| 5,272,392 A | * | 12/1993 | Wong et al. | 327/109 |
| 6,396,249 B1 | | 5/2002 | Itakura et al. | |
| 7,339,775 B2 | * | 3/2008 | Kimura | 361/93.1 |
| 8,159,795 B2 | * | 4/2012 | Nakamura | 361/56 |
| 2003/0169025 A1 | * | 9/2003 | Finney | 323/276 |
| 2005/0200398 A1 | | 9/2005 | Arai | |
| 2006/0133000 A1 | * | 6/2006 | Kimura | 361/93.1 |

FOREIGN PATENT DOCUMENTS

| | | |
|---|---|---|
| JP | 6-217453 A | 8/1994 |
| JP | 2001-168697 A | 6/2001 |
| JP | 2005-260658 A | 9/2005 |

OTHER PUBLICATIONS

Office Action dated Jul. 9, 2013 issued by the Japanese Patent Office in corresponding Japanese Patent Application No. 2010-045583.

* cited by examiner

*Primary Examiner* — Timothy J Dole
*Assistant Examiner* — Afework Demisse
(74) *Attorney, Agent, or Firm* — Sughrue Mion, PLLC

(57) ABSTRACT

A semiconductor device of the present invention includes an output transistor connected between a power supply terminal and an output terminal; a detection transistor generating a detection current that is proportional to a current flowing through the output transistor; a detection voltage generation unit generating a detection voltage based on a detection current; a protection transistor drawing a current from a control terminal of the output transistor to the output terminal according to the detection voltage; and a limited current generation circuit that generates a limited current that is obtained by converting a limit setting current that sets a current flowing through the output transistor in a protection state according to a variation of a threshold voltage of the protection transistor and a variation of the detection voltage with respect to the detection current, and supplies the limited current to a first terminal of the protection transistor.

18 Claims, 7 Drawing Sheets

SEMICONDUCTOR DEVICE

CROSS-REFERENCE TO RELATED APPLICATIONS

This application is based upon and claims the benefit of priority from Japanese patent application No. 2010-045583, filed on Mar. 2, 2010, the disclosure of which is incorporated herein in its entirety by reference.

BACKGROUND

The present invention relates to a semiconductor device, and more particularly to a semiconductor device including an output transistor that performs switching of high current.

A power semiconductor device that performs switching of high current limits a current that flows through an output transistor when short-circuit or malfunction is caused in a load connected to an output terminal. The power semiconductor device prevents the destruction of the semiconductor device by limiting the current that flows through the output transistor. One example of a method of limiting a current that flows through an output transistor is disclosed in Japanese Unexamined Patent Application Publication No. 2005-260658.

FIG. 5 shows an application example that uses a semiconductor device disclosed in Japanese Unexamined Patent Application Publication No. 2005-260658 as a so-called high-side switch (configuration in which the semiconductor device is connected to a higher-potential side than a load). In a semiconductor device 200 shown in FIG. 5, a series circuit of a detection transistor 203 and a detection resistor R204 is connected in parallel to an output transistor 202 that supplies a load current to a load RL, and a detection current that is substantially proportional to the output current (load current) that flows through the output transistor 202 flows through the detection transistor 203 and the detection resistor R204. A protection transistor 204 is connected between the gate and the source of the output transistor 202, and the gate of the protection transistor 204 is connected to a node between the detection transistor 203 and the detection resistor R204.

A control signal 205 that turns on/off the output transistor 202 is input from an input terminal IN. In this application example, since a high-side switch is employed in which an N-channel transistor is used as the output transistor 202, the voltage Vin of the control signal 205 in ON state is boosted to be higher than the voltage of a power supply terminal VB by a charge pump or the like (not shown).

When the output current that flows through the output transistor 202 increases and the detection current that flows through the detection transistor 203 and the detection resistor R204 increases in accordance therewith, the voltage that is generated in both ends of the detection resistor R204 (gate-source voltage Vgs204 of the protection transistor 204) increases. When the Vgs204 exceeds the threshold voltage of the protection transistor 204, the protection transistor 204 turns ON and the gate-source voltage of the output transistor 202 is lowered, which decreases the output current. Since the detection current decreases in accordance therewith, negative feedback is applied to decrease the Vgs204, and the output current is limited when it becomes in an equilibrium state.

Accordingly, the semiconductor device 200 shown in FIG. 5 includes a current limiting function to limit the control voltage applied to the gate of the output transistor 202 (and the detection transistor 203) when overcurrent flows through the output transistor 202.

However, the semiconductor device 200 has a problem that, as will be described below, variations of the resistance value and the threshold voltage due to manufacturing variations of the detection resistor R204 and the protection transistor 204 cause variations of the current that should be limited (output current that flows through the output transistor 202).

First, description will be made of the current limiting operation of the semiconductor device 200 as shown in FIG. 5. When a conducting current of the output transistor 202 is denoted by I202, and a conducting current of the detection transistor 203 is denoted by I203, the relation shown in the expression (1) is substantially obtained, although some deviation is caused strictly due to a voltage drop in the detection resistor R204. In the expression (1), the area ratio of the output transistor 202 to the detection transistor 203 is set to 1000:1.

Expression 1

$$I202 = 1000 \cdot I203 \quad (1)$$

The condition in which the current is limited is when the voltage decrease of the detection resistor R204 is equal to or more than the threshold value of the protection transistor 204. In summary, the relation between the threshold voltage Vt204 of the protection transistor 204 and the detection current I203 in which current limiting operation is started can be obtained by the expression (2). The symbol R204 in the expression (2) shows the resistance value of the detection resistor R204.

Expression 2

$$Vt204 = I203 \cdot R204 \quad (2)$$

From the above expressions (1) and (2), the current value I202 of the limited current of the output transistor 202 is determined by the expression (3).

Expression 3

$$I202 = 1000 \cdot \frac{Vt204}{R204} \quad (3)$$

From the expression (3), it is understood that variations of the threshold voltage Vt204 of the protection transistor 204 and the resistance value of the detection resistor R204 increase variations of the current value of the output current I202 that is limited. For example, it is empirically observed that variations of Vt204 by ±30% and R204 by ±30% cause variations of the current value I202 by ±42%.

On the other hand, Japanese Unexamined Patent Application Publication No. 2001-168697 discloses a technique of suppressing variations of the output current that is limited by driving the gate of the output transistor by a constant current.

As shown in FIG. 6, a semiconductor device 100 is a so-called low-side switch (configuration in which the semiconductor device is connected to a lower-potential side than a load). In this semiconductor device 100, an output terminal OUT is connected to a power supply through a load RL, and a ground potential is supplied to a ground terminal GND. An output transistor 102 and a detection transistor 103 are connected in parallel. Further, an NMOS transistor 107 is connected in series with the detection transistor 103. An NMOS transistor 108 constitutes a current mirror circuit with the NMOS transistor 107. Further, an NMOS transistor 109 has a diode-connected configuration in which the gate and the drain are connected, and is connected to a node between gates of the detection transistor 103 and the output transistor 102. The NMOS transistor 109 that is diode-connected is connected to make the gate-source voltage of the detection transistor 103 equal to the gate-source voltage of the output transistor 102. In summary, if threshold voltages of the NMOS transistor 109 and the NMOS transistor 107 connected in series with the detection transistor 103 are equal to each other, the gate-source voltages of the output transistor 102 and the detection transistor 103 are equal to each other. Thus, the detection transistor 103 is able to accurately detect the output current that flows through the output transistor 102. Further, a constant current source 106 is connected to the gate of the detection transistor 103 and the gate of the output transistor 102 via the diode-connected NMOS transistor 109, and drives the detection transistor 103 and the output transistor 102 by a constant current.

SUMMARY

By the way, when the configuration of the semiconductor device 100 is used as a so-called high-side switch, the circuit configuration as shown in FIG. 7 may be obtained. A power supply voltage Vcc is applied to a power supply terminal VB of a semiconductor device 100a, and an output terminal OUT is connected to a load RL. Further, a voltage that is boosted to be higher than the power supply voltage Vcc needs to be applied to the gate of an output transistor 102 by a charge pump or the like (not shown) as an ON signal.

However, the present inventors have found that a serious problem is caused when the semiconductor device 100a is monolithically integrated on a single substrate. Hereinafter this problem will be described.

In order to achieve the configuration shown in FIG. 7, NMOS transistors 107 to 109 need to be formed of lateral NMOS transistors. The problem is caused in the NMOS transistor 109 formed of a lateral NMOS transistor. FIG. 8 shows a cross-sectional view of the semiconductor device 100a showing configurations of the output transistor 102 and the lateral NMOS transistor 109. In FIG. 8, an impurity diffusion region in which the drain of the NMOS transistor is formed is denoted by the signal D, an impurity diffusion region in which the source is formed is denoted by the signal S, a gate electrode is denoted by the signal G, and an impurity diffusion region where the back gate contact region is formed is denoted by the signal B.

Since the output transistor 102 is the vertical transistor, an $N^+$ type semiconductor substrate $N^+$ (sub) and an $N^-$ epitaxial layer $N^-$ (epi) serve as a drain region of the output transistor 102. The lateral NMOS transistor is formed in a P-well formed in the $N^-$ epitaxial layer, and an $N^+$ region including the source region S, the drain region D and a $P^+$ region which is the back gate contact region B are formed in the P-well. The drain region D and the gate electrode G of the NMOS transistor 109 are commonly connected, and are connected to both the constant current source 106 and the gate of the detection transistor 103 shown in FIG. 7. The source region S and the back gate contact region B of the NMOS transistor 109 are commonly connected, and are connected to the gate electrode G of the output transistor 102.

Since the gate of the output transistor 102 is normally driven by the voltage which is boosted to be twice or more higher than the voltage of the power supply terminal VB, the boosted voltage is applied to the back gate contact region B of the NMOS transistor 109. Referring now to FIG. 8, when the boosted voltage is applied to the back gate contact region B of the NMOS transistor 109, a parasitic diode 110 formed between the P-well and the $N^-$ epitaxial layer of the NMOS transistor 109 is rendered conductive, which produces malfunction in the circuit operation. In summary, since the boosted voltage that should be applied to the gate of the output transistor 102 flows through the $N^+$ semiconductor substrate (drain of the output transistor 102) through the parasitic diode 110, the voltage of the gate of the output transistor 102 is not boosted up. Further, the parasitic diode 110 may be destroyed due to large current flowing through the parasitic diode 110.

A first aspect of the present invention is a semiconductor device including: an output transistor including a control terminal connected to a drive signal input terminal, a first terminal connected to a power supply terminal, and a second terminal connected to an output terminal, the output terminal being to be connected to a load; a detection transistor including a control terminal commonly connected to the control terminal of the output transistor, and a first terminal connected to the power supply terminal, the detection transistor monitoring a current flowing through the output transistor and generating a detection current that is proportional to an output current; a detection voltage generation unit that is connected between a second terminal of the detection transistor and the output terminal, the detection voltage generation unit generating a detection voltage based on the detection current; a protection transistor including a first terminal connected to the control terminal of the output transistor, and a second terminal connected to the output terminal, the protection transistor drawing a current from the control terminal of the output transistor to the output terminal when the detection voltage reaches a threshold voltage that is set in advance; and a limited current generation circuit that generates a limit setting current that sets an output current flowing through the output transistor in a state in which a current flows through the protection transistor, generates a limited current that is obtained by converting the limit setting current according to a variation of the threshold voltage of the protection transistor and a variation of the detection voltage with respect to the detection current, and supplies the limited current to the first terminal of the protection transistor.

According to the semiconductor device of the present invention, the limited current generation circuit generates a limit setting current that sets a limit value of an output current that flows through the output transistor. Then the limited current generation circuit generates a limited current that is obtained by converting the limit setting current according to the variation of the threshold voltage of the protection transistor and the variation of the detection voltage with respect to the detection current. More specifically, by providing in the limited current generation circuit the compensation transistor having the variation of the threshold voltage that is shifted in the same direction as the variation of the threshold voltage of the protection transistor and the compensation resistor having the variation of the resistance value that is shifted in the same direction as the variation of the resistance value of the detection resistor that generates the detection voltage, the limited current that determines the current flowing through the protection transistor is converted to reflect the variation of the threshold voltage of the protection transistor and the variation of the resistance value of the detection resistor. In summary, the limited current is corrected in accordance with the variations. Accordingly, the output current of the output transistor is limited to a certain current value regardless of the variation of the threshold voltage of the protection transistor and the variation of the resistance value of the detection resistor.

A semiconductor device according to the present invention makes it possible to keep the limit value of an output current that flows through an output transistor constant regardless of a variation of a threshold voltage of a protection transistor and a variation of a detection voltage with respect to a detection current.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
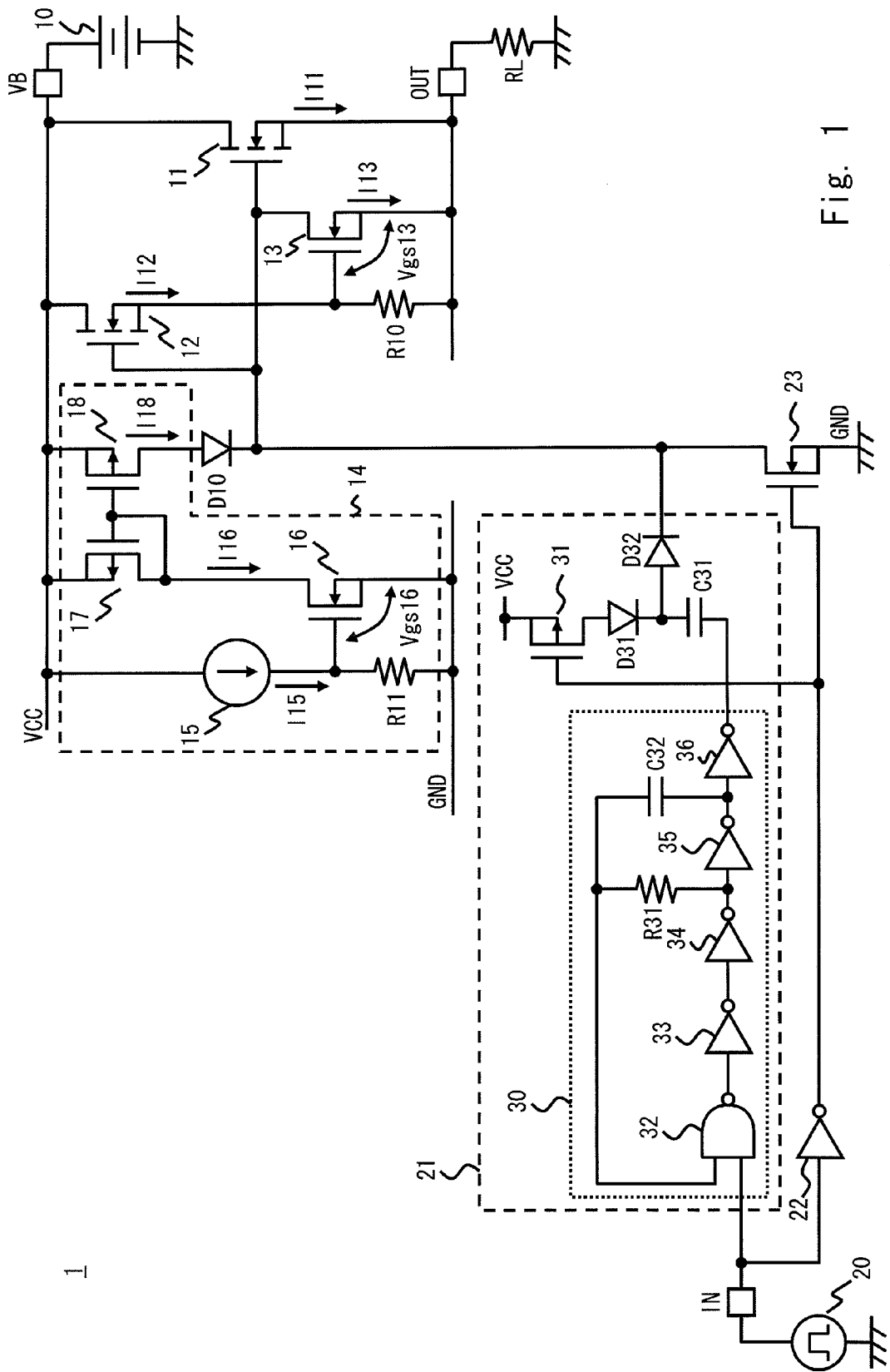
FIG. 1 is a circuit diagram of a semiconductor device 1 according to a first embodiment of the present invention.

Hereinafter, embodiments of the present invention will be described with reference to the drawings. FIG. 1 is a circuit diagram of a semiconductor device 1 according to a first embodiment. As shown in FIG. 1, the semiconductor device 1 includes an output transistor 11, a detection transistor 12, a protection transistor 13, a detection voltage generation unit (e.g., a detection resistor R10), a limited current generation circuit 14, and a charge pump circuit 21. The semiconductor device 1 receives a power supply voltage VCC from a power supply 10 through a power supply terminal VB and a ground voltage GND from a ground terminal, and operates based on the power supply voltage VCC and the ground voltage GND. Further, a load RL is connected between an output terminal OUT and another ground terminal, so that the semiconductor device 1 drives the load RL. Further, the semiconductor device 1 includes a control signal input terminal IN, and switches ON/OFF of the output transistor 11 based on a control signal 20.

Further, in the first embodiment of the present invention, the circuits are mainly formed of MOS transistors. Each transistor has a first terminal serving as the drain, a second terminal serving as the source, and a control terminal serving as the gate.

The output transistor 11 has a drain connected to the power supply terminal VB, and a source connected to the output terminal OUT. Further, a gate voltage which is boosted to be higher than the power supply voltage VCC by the charge pump circuit 21 is supplied to the gate of the output transistor 11 based on an ON signal input from the control signal input terminal IN. The output transistor 11 is an N-channel vertical MOS transistor formed on an N-type semiconductor substrate.

The detection transistor 12 has a gate commonly connected to the output transistor 11, a drain connected to the power supply terminal VB, and a source connected to one end of the detection resistor R10. Then, the detection transistor 12 generates a detection current I12 that is proportional to and output current I11 that flows through the output transistor 11. The detection transistor 12 is an N-channel vertical MOS transistor formed by the same process as the output transistor 11 and having a different size from the output transistor 11 (e.g., having a different number of transistor cells).

The detection voltage generation unit is formed of the detection resistor R10 in the first embodiment. The detection resistor R10 is connected between the source of the detection transistor 12 and the output terminal OUT. The detection resistor R10 then generates the detection voltage (voltage corresponding to a gate-source voltage Vgs13 of the protection transistor 13) based on the detection current I12.

The protection transistor 13 has a drain connected to the gate of the output transistor 11, and a source connected to the output terminal OUT. Further, the gate of the protection transistor 13 is connected to a node between the detection resistor R10 and the source of the detection transistor 12. The protection transistor 13 turns ON when the detection voltage reaches a threshold voltage that is set in advance (e.g., threshold voltage of the protection transistor 13), and draws a current from the gate of the output transistor 11 to the output terminal OUT. The protection transistor 13 is formed of a lateral NMOS transistor.

The limited current generation circuit 14 is a circuit that generates a constant current to drive the gate of the output transistor 11 at a constant voltage in the state in which a current I13 flows through the protection transistor 13, and includes a circuit that offsets the variation of a threshold voltage value of the protection transistor 13 and the variation of a resistance value of the detection resistor R10. In the first embodiment, a boosted voltage is supplied to the gate of the output transistor 11 as a drive signal. Thus, a reverse-current prevention element is provided to prevent a reverse current from flowing into a limited current output terminal that outputs a limit current I18 in the limited current generation circuit 14. In the first embodiment, the reverse-current prevention element is a diode D10 having an anode connected to the limited current generation circuit 14 and a cathode connected to the gate of the output transistor 11 (or an output terminal of the charge pump circuit 21, for example).

The limited current generation circuit 14 includes a current source 15, a compensation resistor R11, a compensation transistor 16, and a first current mirror circuit.

The current source 15 generates a limit setting current I15. The current source 15 has one end connected to the power supply terminal VB, and the other end connected to one end of the compensation resistor R11. The limit setting current I15 sets the current value corresponding to the current value of the detection current I12 that flows through the detection transistor 12 in a state in which an output current I11 of the output transistor 11 is judged to be overcurrent. Further, although the current flows through the protection transistor 13 in a state in which the output current I11 of the output transistor 11 is judged to be overcurrent, the limit setting current I15 sets the current value of the current I13 that flows through the protection transistor 13 with this state.

The compensation resistor R11 is provided between the current source 15 and the ground terminal. Further, the compensation resistor R11 is formed by the same process as the detection resistor R10. Therefore, manufacturing variations of the detection resistor R10 and the compensation resistor R11 are equal to each other, and both resistance values shift in the same direction.

The compensation transistor 16 has a gate to which a voltage generated by the compensation resistor R11 and the limit setting current I15 is supplied, and a source connected to the ground terminal. Further, the drain of the compensation transistor 16 is connected to the first current mirror circuit. The compensation transistor 16 is formed by the same process as the protection transistor 13. Therefore, the manufacturing variations of the protection transistor 13 and the compensation transistor 16 are equal to each other, and both threshold voltages shift in the same direction.

The first current mirror circuit is constituted by a PMOS transistor 17 (first PMOS transistor) and a PMOS transistor 18 (second PMOS transistor). The drain of the PMOS transistor 17 is connected to the drain of the compensation transistor 16. The gate of the PMOS transistor 17 is connected to the drain of the PMOS transistor 17. The source of the PMOS transistor 17 is connected to the power supply terminal VB. The gate of the PMOS transistor 18 is commonly connected to the gate of the PMOS transistor 17. The source of the PMOS transistor 18 is connected to the power supply terminal VB. The drain of the PMOS transistor 18 is an output terminal of the limited current generation circuit 14 and is connected to the anode of the diode D10.

The PMOS transistors 17 and 18 are formed by the same process. Accordingly, manufacturing variations of the PMOS transistors 17 and 18 are equal to each other, and the values of the currents that flow through each of the PMOS transistors 17 and 18 shift in the same direction. More specifically, the first current mirror circuit allows a current I16 flowing through the compensation transistor 16 to flow through the PMOS transistor 17, and outputs the current that is proportional to the current I16 that flows through the PMOS transistor 17 (current that is equal to the current I16 when the PMOS transistors 17 and 18 have the same size) as the limit current I18. In short, the first current mirror circuit generates the limit current I18 based on the current I16 that flows through the compensation transistor 16.

In summary, since the variation of the voltage in the both ends of the detection resistor R10 and the variation of the voltage in the both ends of the compensation resistor R11 shift in the same direction, the gate-source voltage Vgs13 of the protection transistor 13 and a gate-source voltage Vgs16 of the compensation transistor 16 shift in the same direction. Further, the variation of the threshold voltage of the protection transistor 13 and the variation of the threshold voltage of the compensation transistor 16 shift in the same direction. Therefore, even when the resistance value of the detection resistor R10 or the threshold voltage of the protection transistor 13 varies, the variation is reflected in the limit current I18 by the compensation resistor R11 and the compensation transistor 16, thereby making it possible to suppress the variation of the current limiting operation of the protection transistor 13. In summary, the variation amount of the electrical characteristics of the detection resistor R10 and the protection transistor 13 is cancelled from the limit current I18 by the compensation resistor R11 and the compensation transistor 16, thereby making the current limiting operation of the output current I11 constant.

The variation of the current limiting operation can be minimized when the detection resistor R10 and the compensation resistor R11, the protection transistor 13 and the compensation transistor 16, and the PMOS transistor 17 and the PMOS transistor 18 are made to have the same size with each other. However, when they are formed by the same process, the variation of the electrical characteristics shifts in the same direction even when the size is different. Thus, the advantageous effect can be obtained even when the size is changed as appropriate so as to obtain a desired current value or resistance value.

The charge pump circuit 21 boosts the power supply voltage VCC, generates a drive signal, and supplies the drive signal to a drive signal input terminal. The charge pump circuit 21 shown in FIG. 1 is one example of a double booster circuit. More specifically, the charge pump circuit 21 includes a clock generation circuit 30, a PMOS transistor 31, diodes D31 and D32, and a capacitor C31.

The clock generation circuit 30 includes a ring oscillator, and a buffer unit. The ring oscillator generates clock signals by odd number of inverting circuits. The buffer unit supplies the clock signal generated by the ring oscillator to one end of the capacitor C31. Note that the clock generation circuit 30 shown in FIG. 1 is a specific example.

The ring oscillator includes a NAND circuit 32, inverters 33 and 34, a resistor R31, and a capacitor C32. The NAND circuit 32 includes first and second input terminals. The NAND circuit 32 has a first input terminal that receives the control signal 20, and a second input terminal that is connected to one end of the resistor R31. The control signal 20 turns the output transistor 11 ON (high active) when the control signal 20 is High. At this time, the NAND circuit 32 functions as an inverter when the control signal 20 is High. Further, the NAND circuit 32 fixes the output to High when the control signal 20 is Low. Then, the NAND circuit 32, and the inverters 33 and 34 are connected in series. The output of the inverter 34 is connected to the other end of the resistor R31 and is connected to an input of the buffer unit. The capacitor C32 has one end connected to one end of the resistor R31, and the other end connected to the output terminal of the inverter 35 that is provided in the first stage of the buffer unit. The ring oscillator sets the frequency of the clock signal based on a delay time of the NAND circuit 32 and the inverters 33 and 34, and a time constant set by the resistor R31 and the capacitor C32.

The buffer unit includes inverters 35 and 36. An input terminal of the inverter 35 is connected to an output terminal of the ring oscillator (which is the output terminal of the inverter 34). An input terminal of the inverter 36 is connected to an output terminal of the inverter 35. Further, an output terminal of the inverter 36 is connected to one end of the capacitor C31. In summary, the buffer unit raises or lowers the voltage in the one end of the capacitor C31 by the clock signal generated by the ring oscillator.

The PMOS transistor 31 has a source connected to the power supply terminal VB, and a drain connected to the anode of the diode D31. Further, an inverting signal of the control signal 20 is supplied to the gate of the PMOS transistor 31. The diode D31 has a cathode connected to the other end of the capacitor C31. The diode D32 has an anode connected to the cathode of the diode D31 and the other end of the capacitor C31. The diode D32 has a cathode that serves as an output terminal of the charge pump circuit 21.

The charge pump circuit 21 generates the clock signal by the ring oscillator in the state in which the control signal 20 is High. Further, when the control signal 20 is High, the gate voltage of the PMOS transistor 31 is Low, and the PMOS transistor 31 is rendered conductive. Then, charge is stored in the capacitor C31 when the clock signal is in the Low level, and the charge stored in the capacitor C31 is transferred to the gate of the output transistor 11 in the state in which the clock signal is High level. Accordingly, a boosted voltage that is higher than the power supply voltage VCC is applied to the gate of the output transistor 11. This boosted voltage serves as the drive signal applied to the gate of the output transistor 11.

The semiconductor device 1 shown in FIG. 1 includes an NMOS transistor 23 that makes the gate voltage of the output transistor 11 Low level to turn off the output transistor 11 when the control signal 20 becomes Low. The NMOS transistor 23 has a source connected to the ground terminal, and a drain connected to the output terminal of the charge pump circuit 21 (or the gate of the output transistor 11). Further, a signal obtained by inverting the control signal 20 by an inverter 22 is supplied to the gate of the NMOS transistor 23. In summary, the NMOS transistor 23 is in an OFF state when the charge pump circuit 21 supplies the boosted voltage to the gate of the output transistor 11 (when the control signal 20 is High level), and the NMOS transistor 23 is in an ON state when the charge pump circuit 21 stops (when the control signal 20 is Low level). Accordingly, the low level voltage (e.g., ground voltage) is applied to the gate of the output transistor 11 to make the output transistor 11 turn OFF when the control signal 20 is in the Low level.

Next, an operation of the semiconductor device 1 will be described. The semiconductor device 1 has three operation modes of an operation state, a stopped state, and a protection state. In the following description, the semiconductor device 1 which is in the operation state will be described.

First, the operation state will be described. When the electric power is supplied to the load RL (when the output transistor 11 turns ON), the high-level control signal 20 is input to the control signal input terminal IN. Then, the charge pump circuit 21 generates the boosted voltage as a drive signal applied to the gate of the output transistor 11. The output transistor 11 is rendered conductive based on the boosted voltage. Then, a potential of the output terminal OUT is raised to substantially equal to the power supply voltage VCC. Hence, the voltage difference between the source and the drain of the detection transistor 12 and the voltage difference of both ends of the detection resistor R10 are substantially equal to 0 V. In summary, the source-gate voltage Vgs13 of the protection transistor 13 is substantially equal to 0 V in the operation state, which means the protection transistor 13 is in an OFF state.

Next, the stopped state will be described. When the power supply to the load RL is stopped (when the output transistor 11 turns OFF), the low-level control signal 20 is input to the control signal input terminal IN. Then, the charge pump circuit 21 stops the boosting operation, and the NMOS transistor 23 is rendered conductive. Hence, the gate voltage of the output transistor 11 reaches the ground voltage, and the output transistor 11 is brought into an OFF state. Further, since the current is not output from the output terminal OUT, the output terminal OUT is substantially equal to the ground voltage. Further, the current I12 does not flow through the detection transistor 12 as well, and the voltage difference between both ends of the detection resistor R10 is substantially equal to 0V. In summary, the source-gate voltage Vgs13 of the protection transistor 13 is substantially equal to 0 V in the stopped state, which makes the protection transistor 13 an OFF state.

Next, the protection state will be described. The protection state means the state in which it is detected that overcurrent flows through the output transistor 11, and means the state in which the output current I11 that flows through the output transistor 11 is limited to a predetermined current value. The state in which overcurrent flows means the state in which, due to an extreme decrease in the voltage of the output terminal OUT when failure occurs such as short-circuit in the load RL, for example, the voltage difference between the source and the drain of the output transistor 11 becomes large, and the output current I11 that flows through the output transistor 11 becomes excessively large.

In summary, in a state before transition to the protection state, the voltage of the output terminal OUT is reduced and the voltage difference between the gate and the source of the output transistor 11 increases, which increases the output current I11. The detection current I12 that flows through the detection transistor 12 has a current value that is proportional to the output current I11 that flows through the output transistor 11. For example, assume that the size (cell number) ratio of the output transistor 11 to the detection transistor 12 is 1000:1. Then the relation between the output current I11 and the detection current I12 can be obtained by the expression (4).

Expression (4)

$$I11 = 1000 \cdot I12 \qquad (4)$$

The detection current I12 flows through the detection resistor R10. At this time, the detection voltage Vgs13=I12×R10 is generated in both ends of the detection resistor R10. When the detection voltage Vgs13 reaches the threshold voltage Vtn13 of the protection transistor 13, the protection transistor 13 is rendered conductive. Then, the protection transistor 13 allows the limit current I18 output from the limited current generation circuit 14 to flow as the current I13. In summary, the current limiting operation is performed in a state in which the current I13 becomes equal to the limit current I18. At this time, the current I13 is obtained by the expression (5). In the expression (5), β denotes a conductance constant of the protection transistor 13, W13 denotes a gate width of the protection transistor 13, L13 is a gate length of the protection transistor 13, Vgs13 is a gate-source voltage of the protection transistor 13, and Vtn13 is a threshold voltage of the protection transistor 13.

Expression 5

$$\begin{aligned} I18 &= I13 \\ &= \frac{\beta}{2} \cdot \frac{W13}{L13} (Vgs13 - Vtn13)^2 \\ &= \frac{\beta}{2} \cdot \frac{W13}{L13} (I12 \cdot R10 - Vtn13)^2 \end{aligned} \qquad (5)$$

Further, the limit current I18 is limited by the limited current generation circuit 14 based on the limit setting current I15, and can be obtained by the expression (6). In the expression (6), β denotes a conductance constant of the compensation transistor 16, W16 denotes a gate width of the compensation transistor 16, L16 is a gate length of the compensation transistor 16, Vgs16 denotes a gate-source voltage of the compensation transistor 16, and Vtn16 denotes a threshold voltage of the compensation transistor 16. For the sake of simplicity of description, it is assumed in the expression (6) that the mirror ratio of the first current mirror circuit constituted by the PMOS transistors 17 and 18 is 1:1.

Expression 6

$$\begin{aligned} I18 &= I16 \\ &= \frac{\beta}{2} \cdot \frac{W16}{L16} (Vgs16 - Vtn16)^2 \\ &= \frac{\beta}{2} \cdot \frac{W16}{L16} (I15 \cdot R11 - Vtn16)^2 \end{aligned} \qquad (6)$$

If it is assumed that the size of the protection transistor 13 and that of the compensation transistor 16 is the same, the expression (7) can be obtained from the expressions (5) and (6).

Expression 7

$$I12 = \frac{R11}{R10} \cdot I15 \quad (7)$$

From the expressions (4) and (7), it is understood that the relation between the limit setting current I15 and the output current I11 in the semiconductor device 1 can be obtained from the expression (8).

Expression 8

$$I11 = 1000 \times \frac{R11}{R10} \cdot I15 \quad (8)$$

Since the detection resistor R10 and the compensation resistor R11 are formed by the same process, these resistance values shift in the same direction even when there are manufacturing variations. Thus, R11/R10 has the same ratio. Since R11/R10 is the value that is not influenced by manufacturing variations, it is understood from the expression (8) that the variation of the limit value of the output current I11 only depends on the variation of the limit setting current I15.

Now, description will be made of the circuit operation in the protection state in which the output current I11 is limited by the limit setting current I15. In the protection state, the source-gate voltage Vgs13 of the protection transistor 13 is in an equilibrium state when the value of the current I13 is made equal to the value of the limit current I18. In this state, the source-gate voltage of the output transistor 11 is limited by the source-drain voltage of the protection transistor 13, and the output current I11 is limited in this state. Since the detection current I12 that flows through the detection transistor 12 is proportional to the output current I11, the detection current I12 is also limited (1/1000 in this example). Since the detection current I12 flows through the detection resistor R10, the source-gate voltage Vgs13 of the protection transistor 13 satisfies the expression Vgs13=I12×R10.

When it is assumed that the degree of short-circuit of the load is somewhat improved although still being in the over-current state, the potential of the output terminal OUT increases and the output current I11 decreases. Since the detection current I12 decreases in proportional to the output current I11, the source-gate voltage Vgs13 of the protection transistor 13 decreases. Hence, the current I13 that flows through the protection transistor 13 decreases, and the drain potential of the protection transistor 13 (or gate potential of the output transistor 11 and the detection transistor 12) increases. Accordingly, the output current I11 increases, so as the detection current I12, and is in the equilibrium state when the current I13 becomes equal to the limit current I18. In summary, in the protection state, the output current I11 that flows through the output transistor 11 is limited in accordance with the amount of the limit current I18 and the potential of the output terminal OUT.

Since the protection transistor 13 and the compensation transistor 16 are formed by the same process in the semiconductor device 1, the threshold voltages vary by the same ratio. Hence, when the threshold voltage Vtn13 of the protection transistor 13 increases or decreases, the threshold voltage Vtn16 of the compensation transistor 16 increases or decreases in the same way as the threshold voltage Vtn13 of the protection transistor 13. Further, since the detection resistor R10 and the compensation resistor R11 are formed by the same process, these resistance values increase or decrease similarly. Hence, the limit current I18 increases or decreases in accordance with the increase or decrease of the threshold voltage and the increase or decrease of the resistance value. Therefore, the current value of the limit current I18 is set to subtract variations of the threshold voltage Vtn13 and the gate-source voltage Vgs13 of the protection transistor 13 from the limit setting current I15, whereby the current limiting operation of the output current I11 is kept constant. In short, the limit setting current I15 is the only variation factor of the output current I11 in the current limiting operation.

As will be understood from the description above, the semiconductor device 1 according to the first embodiment corrects the current value of the limit current I18 that sets the current limit value of the output transistor 11 according to the variations of the threshold voltage of the protection transistor 13 and the resistance value of the detection resistor R10. In summary, by providing in the limited current generation circuit 14 the compensation transistor 16 and the compensation resistor R11 that include the variations of the threshold voltage and the resistance value that shift in the same direction as the variations of the threshold voltage of the protection transistor 13 and the resistance value of the detection resistor R10, as will be understood from the expression (8), the output current I11 in the protection state (current limit value) is not influenced by the variations of the threshold voltage and the resistance value. Accordingly, variations of the current limit value of the output transistor 11 can be suppressed.

Figure 5:
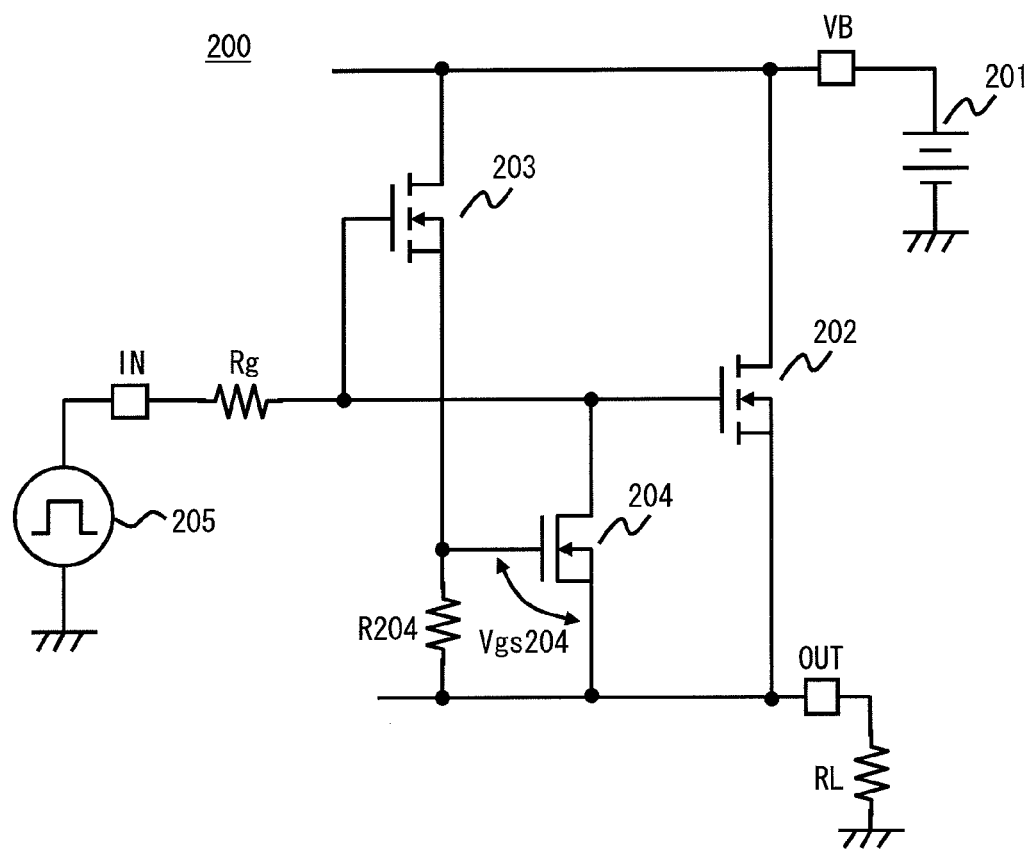
FIG. 5 is a circuit diagram of a semiconductor device 200, which is an application example using a semiconductor device disclosed in Japanese Unexamined Patent Application Publication No. 2005-260658 as a high-side switch.
Figure 6:
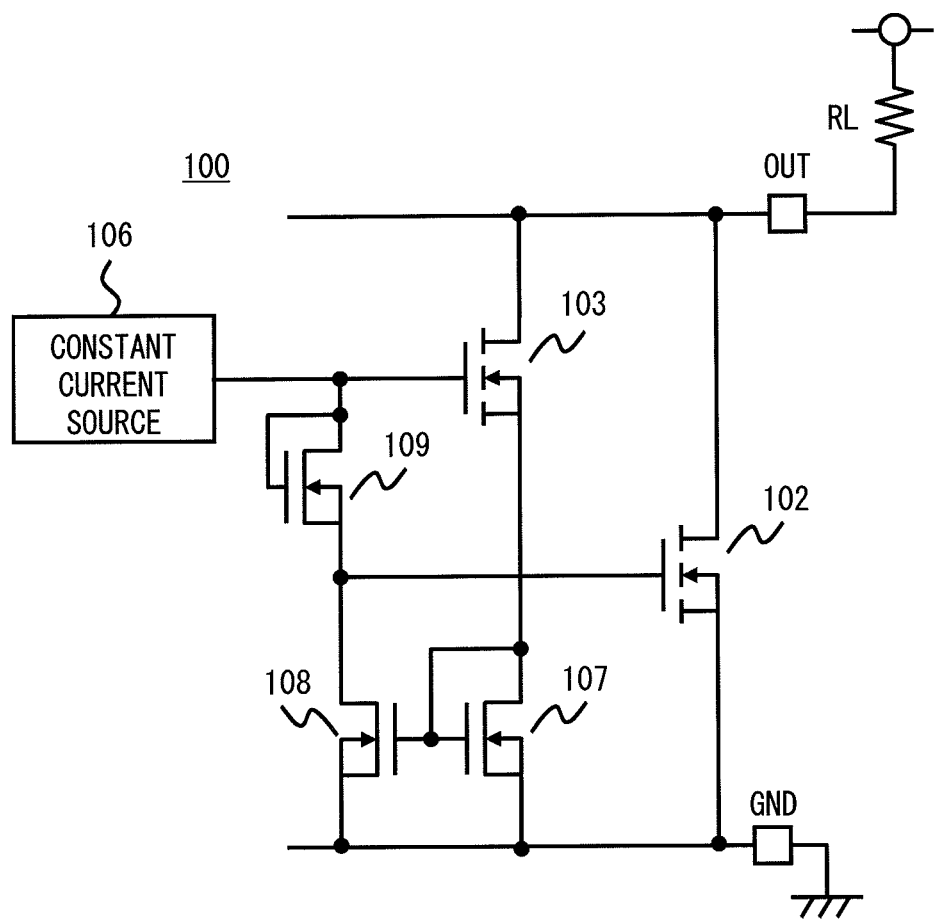
FIG. 6 is a circuit diagram of a semiconductor device 100 disclosed in Japanese Unexamined Patent Application Publication No. 2001-168697.

Assume that the limit setting current I15 varies by ±30%, for example. Then it is understood from the expression (8) that the variation of the current limit value of the output transistor 11 is ±30%, which means it is possible to achieve smaller variation amount compared with the variation of ±42% in the related art (e.g., semiconductor device 200 shown in FIG. 5).

Figure 7:
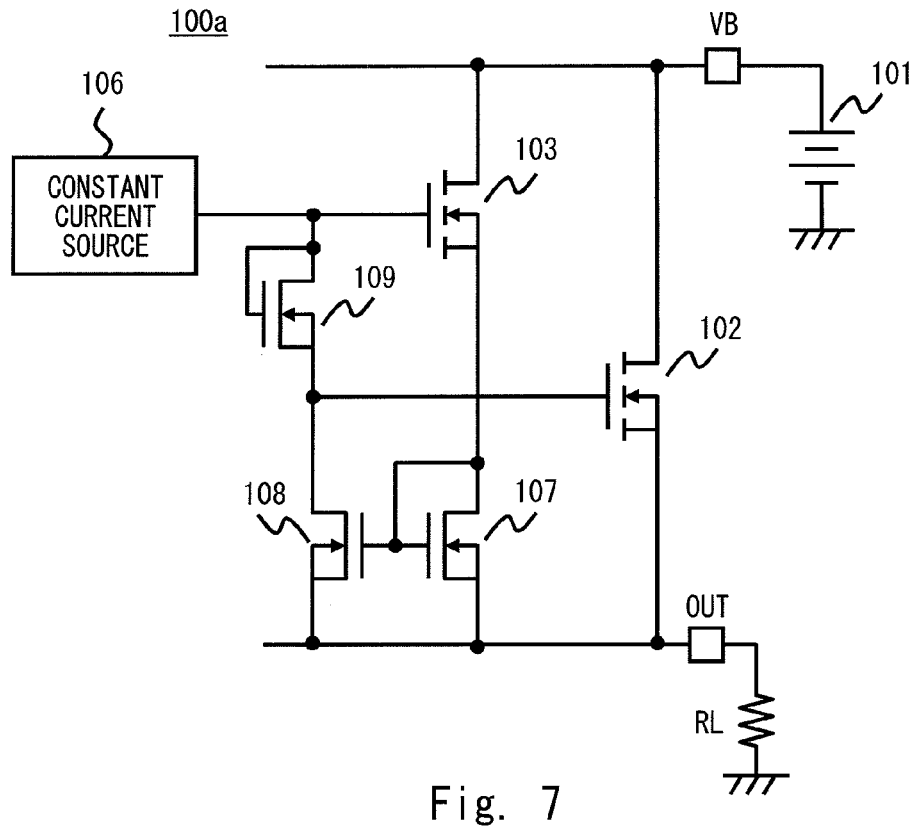
FIG. 7 is a circuit diagram of a semiconductor device 100a which is an application example using the semiconductor device 100 as a high-side switch.

By the way, according to the circuit configuration of the semiconductor device 100a shown in FIG. 7, if it is assumed that the NMOS transistors 107, 108, and 109 are formed by the same process, the manufacturing variations of these transistors should be equal to each other. Accordingly, the variation of the threshold voltage of the NMOS transistor 107 may be cancelled by the variation of the threshold voltage of the NMOS transistor 109, and the variation of the current limiting operation may be reduced.

Figure 8:
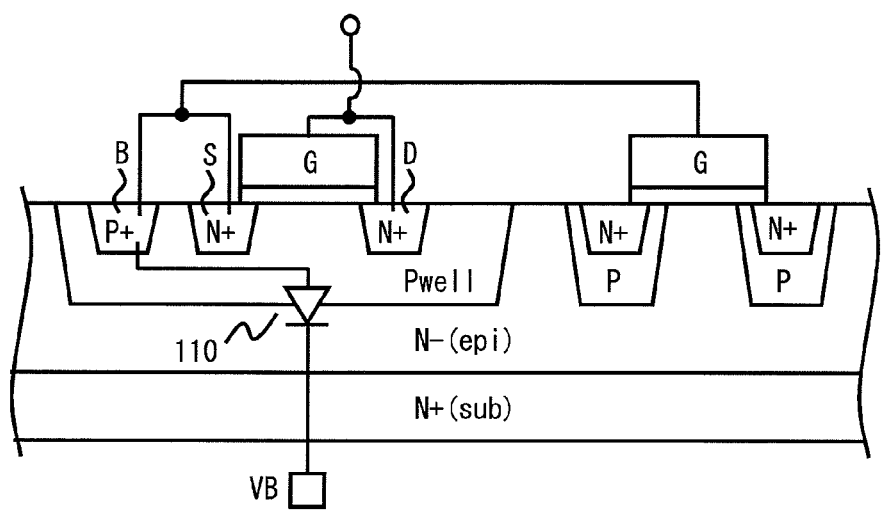
FIG. 8 is a partially cross sectional view to explain a problem of the semiconductor device 100a shown in FIG. 7.

However, as described with reference to FIG. 8, this circuit configuration causes a serious problem in the function as the high-side switch. Specifically, in the semiconductor device 100a, high forward voltage is applied to the parasitic diode 110 formed between the P-well forming the lateral NMOS transistor 109 and the N⁻ epitaxial layer through the N-type semiconductor substrate (N⁺ (sub)) and the back gate contact region B(P⁺) of the NMOS transistor 109. Turning on this parasitic diode causes that a boosted voltage to be applied to the gate of the output transistor 11 is dropped down therethrough.

On the other hand, in the semiconductor device 1 according to the present invention, the potentials of the back gates of the protection transistor 13 and the compensation transistor 16 formed of lateral NMOS transistors are lower than the potential of the N-type semiconductor substrate (potential of the power supply terminal VB). Accordingly, there is no case that a forward voltage is applied to a parasitic diode that is formed between the P-well that forms the protection transistor 13 and the compensation transistor 16 and the N⁻ epitaxial layer.

Therefore, since this parasitic diode is not rendered conductive, there is no problem as the semiconductor device 100a as described above.

Second Embodiment

Figure 2:
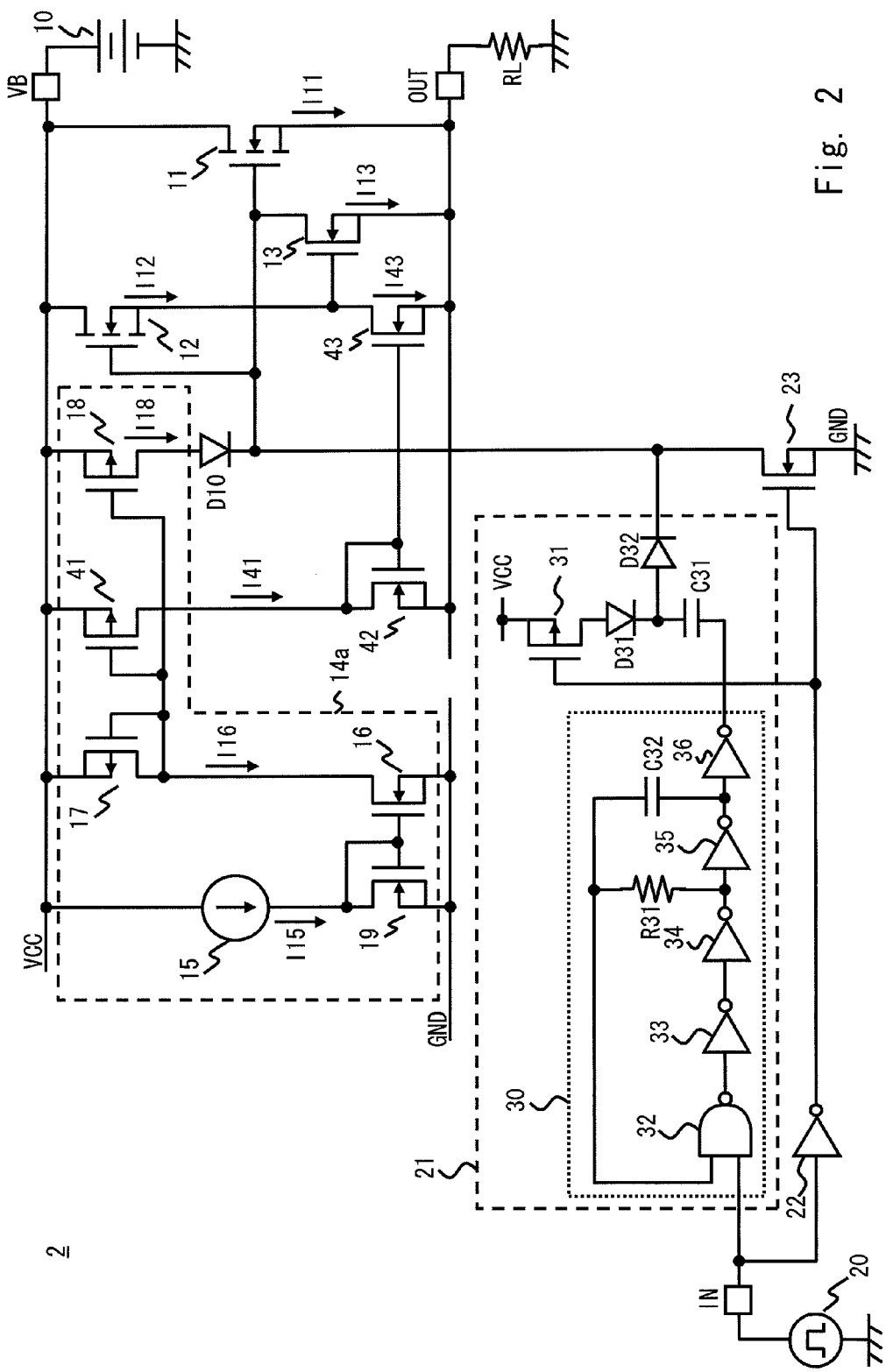
FIG. 2 is a circuit diagram of a semiconductor device 2 according to a second embodiment of the present invention.

FIG. 2 shows a circuit diagram of a semiconductor device 2 according to a second embodiment. As shown in FIG. 2, in the semiconductor device 2, the configurations of the detection voltage generation unit and the limited current generation circuit of the semiconductor device 1 according to the first embodiment are changed to other configurations. More specifically, an NMOS transistor 43 (first transistor) is used instead of the detection resistor R10, and an NMOS transistor 19 (second transistor) is used instead of the compensation resistor R11. Further, the semiconductor device 2 further includes, in addition to the elements of the semiconductor device 1, a second current mirror circuit (described later) and an NMOS transistor 42 (third transistor) to generate a current I43 that flows through the NMOS transistor 43. The NMOS transistor 19 and the second current mirror circuit are added to the limited current generation circuit 14, and a limited current generation circuit to which these elements are added is denoted by a reference symbol 14a. Further, the NMOS transistor 43 and the NMOS transistor 42 constitute a third current mirror circuit, and this constitutes a detection voltage generation unit. The constitutional elements in the semiconductor device 2 according to the second embodiment that are identical to those in the semiconductor device 1 according to the first embodiment are denoted by the same reference symbols, and the description will be omitted.

The NMOS transistor 19 has a drain and a gate commonly connected to the current source 15. Further, the NMOS transistor 19 is connected with the compensation transistor 16 in current mirror circuit configuration. The NMOS transistor 19 and the compensation transistor 16 constitute a fourth current mirror circuit. In short, the limit setting current I15 is supplied to the NMOS transistor 19, and the compensation transistor 16 that is connected with the NMOS transistor 19 in current mirror circuit configuration outputs the current I16 that is proportional to the limit setting current I15. For example, when the mirror ratio of the current mirror circuit constituted by the NMOS transistor 19 and the compensation transistor 16 is 1:1, the current I16 is made equal to the limit setting current I15.

The second current mirror circuit is constituted by a PMOS transistor 17 (first PMOS transistor) and a PMOS transistor 41 (third PMOS transistor). Now, the PMOS transistor 17 is also used in the semiconductor device 1, and the PMOS transistor 41 is newly added. When the mirror ratio of the second current mirror circuit is 1:1, the second current mirror circuit supplies a mirror current I41 of the current I16 that flows through the compensation transistor 16 to the third transistor (e.g., NMOS transistor 42). Note that the PMOS transistors 17 and 41 are formed by the same process.

The NMOS transistor 42 and the NMOS transistor 43 constitute a current mirror circuit. Further, the NMOS transistor 42 has a source connected to the output terminal OUT, a drain connected to the drain of the PMOS transistor 41, and a gate connected to the drain of the NMOS transistor 42.

The NMOS transistor 43 has a drain connected to the source of the detection transistor 12, a source connected to the output terminal OUT, and a gate commonly connected to the gate of the NMOS transistor 42. In summary, the NMOS transistor 43 sets the current value of the current I43 that flows through the NMOS transistor 43 that constitutes the detection voltage generation unit by the current I41 (output current of the PMOS transistor 41) generated so as to correspond to the limit current I18. The NMOS transistor 42, the NMOS transistor 43, the NMOS transistor 19, the compensation transistor 16, and the protection transistor 13 are NMOS transistors that are formed by the same process.

In summary, the semiconductor device 2 uses a third current mirror circuit (for example, constituted by the NMOS transistor 42 and the NMOS transistor 43) that sets the current value of the detection current I12 by the current I41 (e.g., current corresponding to the current I18) as the detection voltage generation unit. The current I41 is set by the second current mirror circuit based on the current I16, and the current I43 is set by the third current mirror circuit based on the current I41. Thus, the current I43 is set based on the current I16. The detection voltage (gate-source voltage Vgs of the protection transistor 13) is in the equilibrium state when the detection current I12 becomes equal to the current I13. Further, in the semiconductor device 2, the limited current generation circuit 14a sets the current I16 by the fourth current mirror circuit based on the limit setting current I15. Thus, the limit current I18 and the current I43 are both set as a mirror current of the limit setting current I15. Accordingly, the current limiting operation of the output current I11 is in the equilibrium state in a state in which the current I13 that flows through the protection transistor 13 and the detection current I12 that flows through the detection transistor 12 are made equal to the limit current I18 and the current I43, respectively. In summary, according to the semiconductor device 2, it is understood that, if every mirror ratio of the first to fourth current mirror circuits is 1:1, the term of (R11/R10) in the above expression (8) is eliminated.

Next, operations of the semiconductor device 2 according to the second embodiment will be described. Since the operations in the normal state and the stopped state of the semiconductor device 2 are substantially the same as those of the semiconductor device 1, the description will be omitted. In the semiconductor device 2, the limit current I18 flows through the protection transistor 13 in the protection state. Further, in the semiconductor device 2, the current value of the detection current I12 in the protection state is set by the current I43 that flows through the NMOS transistor 43. The current I43 is equivalent to the current I41 that varies in proportional to the limit current I18. In summary, in the semiconductor device 2, the current value of the output current I11 in the protection state is set so as to achieve an equilibrium state in which the detection current I12 and the current I43 are equal to each other, and the limit current I18 and the current I13 are equal to each other. Further, the semiconductor device 2 has a configuration in which the variation of the limit current I18 in the limited current generation circuit 14a is proportional only to the variation of the limit setting current I15. In other words, in the semiconductor device 2, the current I16, the current I41, the limit current I18, and the current I43 are set only depending on the variation of the limit setting current I15. In other words, the output current I11 of the semiconductor device 2 in the protection state satisfies the condition in which the term of (R11/R10) in the expression (8) is eliminated described in the first embodiment.

Since in the semiconductor device 2, the variations of the threshold voltages of the protection transistor 13, the NMOS transistor 43, the NMOS transistor 42, the compensation transistor 16, and the NMOS transistor 19 are all shifted in the same direction, the variations of these threshold voltages are offset. Further, since the variations of the threshold voltages of the PMOS transistors 17, 41, and 18 are all shifted in the same direction, the variations of the threshold voltages are offset. Since the limit current I18 and the current I43 are set by the limit setting current I15, the current I13 that flows through the protection transistor 13 and the detection current I12 that flows through the detection transistor 12 are set by the limit setting current I15 in the protection state. Accordingly, the output current I11 in the protection state is limited by the limit setting current I15, and the variation of the limit value of the output current I11 is suppressed.

From the above description, also in the semiconductor device 2 according to the second embodiment, the limit value of the output current I11 in the protection state is set by the condition in which the term of (R11/R10) in the expression (8) is eliminated. Accordingly, it is possible to keep the limit value of the output current I11 constant regardless of the variation of the protection transistor 13 also in the semiconductor device 2 as is similar to the semiconductor device 1.

Third Embodiment

Figure 3:
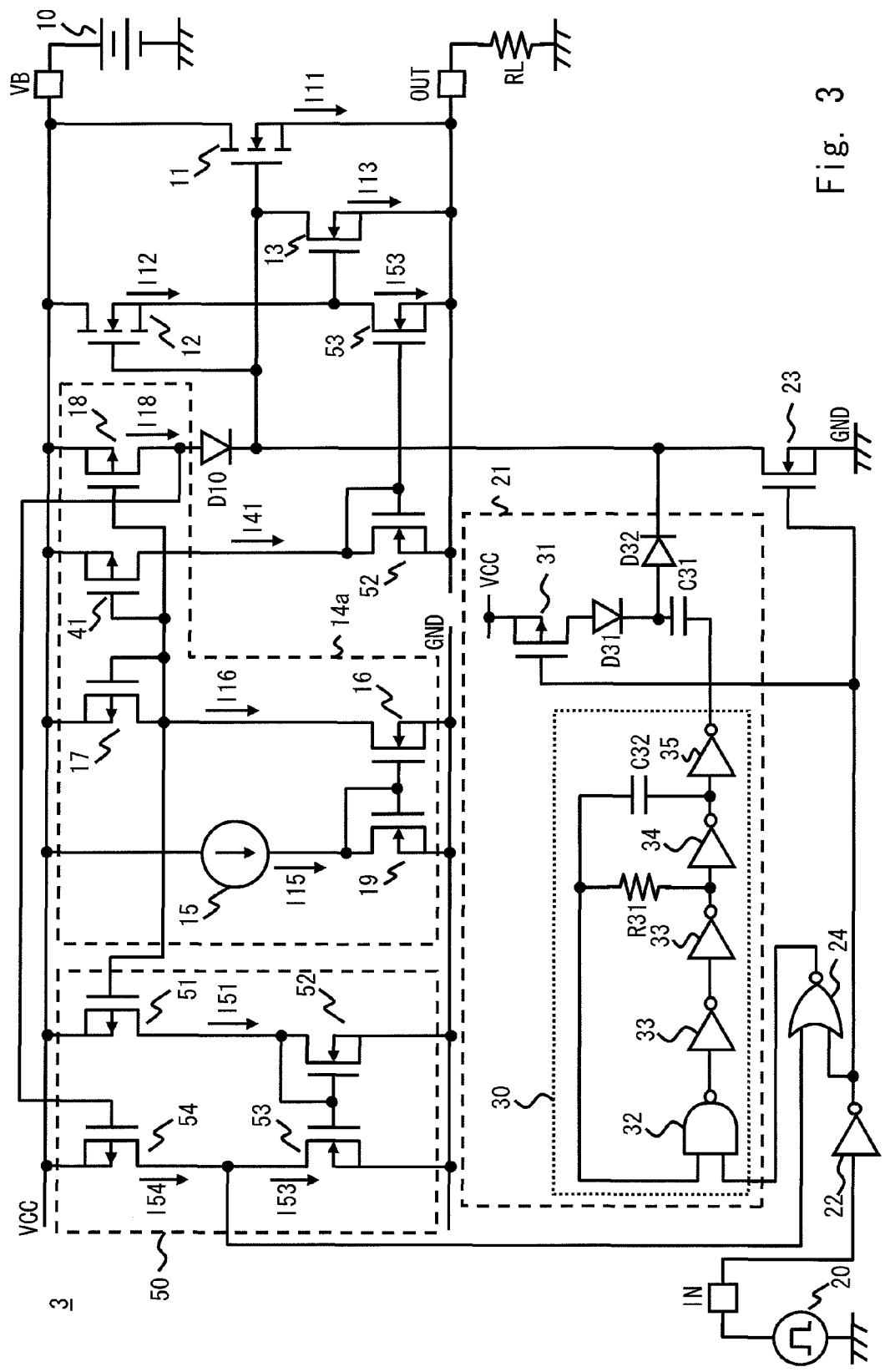
FIG. 3 is a circuit diagram of a semiconductor device 3 according to a third embodiment of the present invention.

FIG. 3 shows a circuit diagram of a semiconductor device 3 according to a third embodiment. As shown in FIG. 3, the semiconductor device 3 is obtained by adding a charge pump activation control circuit 50 to the semiconductor device 2. The charge pump activation control circuit 50 instructs the charge pump circuit 21 to start the generation of the drive signal based on the voltage of the gate of the output transistor 11.

The charge pump activation control circuit 50 includes PMOS transistors 51 and 54, and NMOS transistors 52 and 53. The PMOS transistors 51 and 54 are formed by the same process as the PMOS transistors 17, 18, and 41. Further, the NMOS transistors 52 and 53 are formed by the same process as the protection transistor 13 and the like.

The PMOS transistor 51 and the PMOS transistor 17 are connected with each other in current mirror circuit configuration. The PMOS transistor 54 has a source connected to the power supply terminal VB, and a gate connected to the drain of the PMOS transistor 18. The NMOS transistor 52 has a source connected to the ground terminal, and a drain connected to the drain of the PMOS transistor 51 and to a gate of the NMOS transistor 52. The NMOS transistor 53 has a gate commonly connected to the gate of the NMOS transistor 52, a source connected to the ground terminal, and a drain connected to the drain of the PMOS transistor 54. Then, the output terminal of the charge pump activation control circuit 50 is a connection node between the drain of the NMOS transistor 53 and the drain of the PMOS transistor 54. The output terminal of the charge pump activation control circuit 50 sets the logic level of the charge pump activation control signal that controls the operation of the charge pump circuit 21 by the voltage of the output terminal.

Further, the semiconductor device 3 includes a NOR circuit 24 to control the operation of the charge pump circuit 21 according to two signals of the control signal 20 and a charge pump activation control signal output from the charge pump activation control circuit 50. The NOR circuit 24 has a first input terminal that receives the control signal 20 inverted by the inverter 22, and a second input terminal that receives the charge pump activation control signal. The NOR circuit 24 supplies a signal to instruct the charge pump circuit 21 to start the operation (high-level signal) to the charge pump circuit 21 only when the control signal 20 is in the high level (in high active; the inverter 22 is not required in low active) and the charge pump activation control signal is in the low level.

Now, the operation of the semiconductor device 3 to give an operation instruction to the charge pump circuit 21 will be described. First, when the control signal 20 becomes High, the NMOS transistor 23 is in an OFF state. Then, the limited current generation circuit 14a supplies the limit current I18 to the gate of the output transistor 11. This increases the voltage of the gate of the output transistor 11. At this time, the voltage of the drain of the PMOS transistor 18 is higher than the voltage of the gate of the output transistor 11 by the forward voltage of the diode D10. In summary, since the gate voltage of the output transistor 11 is low in the state immediately after start of supplying the limit current I18, the voltage of the drain of the PMOS transistor 18 makes the PMOS transistor 54 conductive. In short, the charge pump activation control circuit makes the charge pump activation control signal high until when the voltage of the gate of the output transistor 11 sufficiently increases.

When the voltage of the drain of the PMOS transistor 18 increases along with the increase of the voltage of the gate of the output transistor 11 and the voltage of the gate of the output transistor 11 reaches the voltage to make the PMOS transistor 54 an OFF state. This makes the charge pump activation control signal Low. According to the switch of the charge pump activation control signal to the Low level, the output signal of the NOR circuit 24 makes transition to the High level. Then, the charge pump circuit 21 is activated, and generation of the boosted voltage is started.

The time t1 until when the charge pump circuit 21 is activated in the semiconductor device 3 can be calculated by the expression (9). In the expression (9), Cox denotes the gate capacity of the output transistor, and Vout denotes the voltage of the output terminal OUT.

Expression 9

$$t1 \approx \frac{Cox \cdot V_{out}}{I15} \quad (9)$$

Figure 4:
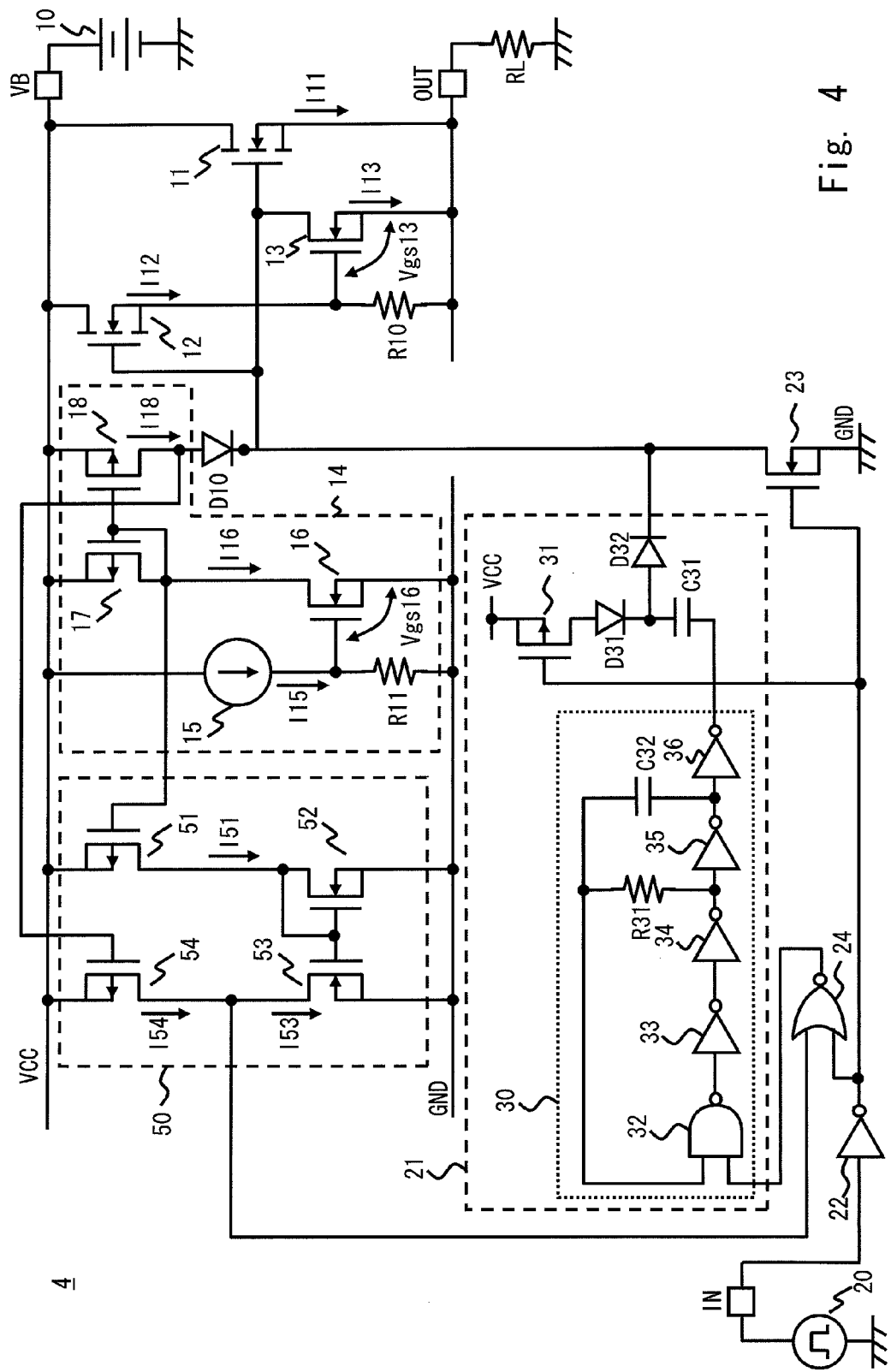
FIG. 4 is a circuit diagram showing a semiconductor device 4, which is a variant example of the semiconductor device 3 according to the third embodiment of the present invention.

The charge pump activation control circuit 50 which is described in the description above can also be added to the semiconductor device 1 shown in FIG. 1. FIG. 4 shows a circuit diagram of a semiconductor device 4 in which the charge pump activation control circuit 50 is added to the semiconductor device 1. The operation of the charge pump activation control circuit 50 in the semiconductor device 4 is substantially the same as that in the semiconductor device 3. Thus, description will be omitted. However, the semiconductor device 4 is different from the semiconductor device 3 in terms of the time required to activate the charge pump circuit 21. In the semiconductor device 4, the time t2 until when the charge pump circuit 21 is activated can be calculated by the expression (10).

Expression 10

$$t12 \approx \frac{Cox \cdot V_{out}}{\frac{\beta}{2} \cdot \frac{W16}{L16}(I15 \cdot R11 - Vtn16)^2} \quad (10)$$

Further, the semiconductor devices 3 and 4 stop the operation of the charge pump circuit 21 by the charge pump activation control circuit 50 in the protection state. While the limit current I18 is output from the limited current generation circuits 14 and 14a in the protection state, substantially the whole limit current I18 is discharged to the output terminal OUT through the protection transistor 13. Thus, the gate voltage of the output transistor 11 is an intermediate voltage between the output voltage and the power supply voltage VCC. Hence, the drain voltage of the PMOS transistor 18 lowers in the protection state than in the operation state. In summary, the PMOS transistor 54 is rendered conductive and the charge pump activation control signal is in the high level in the protection state. Then, the charge pump circuit 21 is in the stopped state when the charge pump activation control signal is in the high level. When the charge pump circuit 21 is in the stopped state in the protection state, the charge pump circuit 21 does not influence on the protecting operation of the output transistor 11 any more. Furthermore, by stopping the charge pump circuit 21 in the protection state, power consumption in the charge pump circuit 21 can be suppressed.

From the above description, it is possible to control the time required to activate the charge pump circuit 21 by the current value of the limit current I18 by using the charge pump activation control circuit 50. As will be understood from the expressions (9) and (10), it is more efficient to add the charge pump activation control circuit 50 to the semiconductor device 2 according to the second embodiment since it requires smaller number of variable numbers to calculate the activation time. In the semiconductor devices 3 and 4, the charge pump activation control circuit 50 transits the charge pump activation control signal to the High level by making the PMOS transistor 54 conductive in the protection state in which the output current I11 of the output transistor 11 is limited, thereby enabling to stop the operation of the charge pump circuit 21. As stated above, by stopping the charge pump circuit 21 in the protection state, the influence given on the voltage of the gate of the output transistor 11 by the charge pump circuit 21 can be prevented. Therefore, it is possible to perform the limiting operation of the output current I11 in the protection state more accurately. In addition, it is possible to suppress power consumption by the charge pump circuit 21 by stopping the charge pump circuit 21 in the protection state.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above. Further, the scope of the claims is not limited by the embodiments described above.

Furthermore, it is noted that, Applicant's intent is to encompass equivalents of all claim elements, even if amended later during prosecution.

For example, although described in the above embodiments is an example in which N-channel MOSFETs are used as the output transistor, the detection transistor, the protection transistor, and the compensation transistor, circuits using P-channel MOSFETs may be applied according to the spirit of the present invention. Further, the charge pump circuit 21 shown in FIGS. 1 to 4 is merely one example of a double booster circuit, and can be another circuit or a circuit that generates three or more times of boosted voltage. Furthermore, the configuration of the charge pump activation control circuit 50 shown in FIGS. 3 and 4 is merely one example, and may be realized by other configuration as well.

What is claimed is:

1. A semiconductor device comprising:
an output transistor including a control terminal connected to a drive signal input terminal, a first terminal connected to a power supply terminal, and a second terminal connected to an output terminal, the output terminal being to be connected to a load;
a detection transistor including a control terminal commonly connected to the control terminal of the output transistor, and a first terminal connected to the power supply terminal, the detection transistor monitoring a current flowing through the output transistor and generating a detection current that is proportional to an output current;
a detection voltage generation unit that is connected between a second terminal of the detection transistor and the output terminal, the detection voltage generation unit generating a detection voltage based on the detection current;
a protection transistor including a first terminal connected to the control terminal of the output transistor, and a second terminal connected to the output terminal, the protection transistor drawing a current from the control terminal of the output transistor to the output terminal when the detection voltage reaches a threshold voltage that is set in advance; and
a limited current generation circuit that generates a limit setting current that sets an output current flowing through the output transistor in a state in which a current flows through the protection transistor, generates a limited current that is obtained by converting the limit setting current according to a variation of the threshold voltage of the protection transistor and a variation of the detection voltage with respect to the detection current, and supplies the limited current to the first terminal of the protection transistor.

2. The semiconductor device according to claim 1, wherein the detection voltage generation unit comprises a detection resistor that is connected between the output terminal and the control terminal of the protection transistor, and
the limited current generation circuit comprises:
a current source that generates the limit setting current;
a compensation resistor that is provided between the current source and a ground terminal;
a compensation transistor that includes a control terminal to which voltage generated in a connection node between the compensation resistor and the current source is supplied, and a second terminal to which the ground terminal is connected; and
a first current mirror circuit that generates the limited current based on a current that flows in the compensation transistor.

3. The semiconductor device according to claim 2, wherein resistance values of the detection resistor and the compensation resistor have manufacturing variations in which characteristics shift in the same direction, and threshold voltages of the protection transistor and the compensation transistor have manufacturing variations in which characteristics shift in the same direction.

4. The semiconductor device according to claim 2, wherein the protection transistor and the compensation transistor are lateral NMOS transistors.

5. The semiconductor device according to claim 2, wherein the detection resistor and the compensation resistor have the same size with each other, and the protection transistor and the compensation transistor have the same size with each other.

6. The semiconductor device according to claim 2, wherein the detection resistor is formed by a first transistor including a first terminal connected to the second terminal of the detection transistor and a second terminal connected to the output terminal,
the compensation resistor is formed by a second transistor including a control terminal and a first terminal connected to the connection node, and a second terminal connected to the ground terminal, the second transistor constituting a fourth current mirror circuit with the compensation transistor, the detection voltage generation unit further comprises a third transistor that constitutes a third current mirror circuit with the first transistor, and the limited current generation circuit further includes a second current mirror circuit that generates a current that flows through the third transistor based on a current that flows through the compensation transistor.

7. The semiconductor device according to claim 6, wherein the protection transistor, the compensation transistor, and the first to third transistors have manufacturing variations in which characteristics shift in the same direction.

8. The semiconductor device according to claim 6, wherein the protection transistor, the compensation transistor, and the first to third transistors are lateral NMOS transistors.

9. The semiconductor device according to claim 6, wherein the protection transistor, the compensation transistor, and the first to third transistors have the same size with each other.

10. The semiconductor device according to claim 6, wherein the second current mirror circuit comprises:
   the first PMOS transistor; and
   a third PMOS transistor including a first terminal connected to the power supply terminal, a control terminal connected to the control terminal of the first PMOS transistor, and a second terminal connected to a control terminal and a second terminal of the third transistor.

11. The semiconductor device according to claim 10, wherein the first to third PMOS transistors have the same size with each other.

12. The semiconductor device according to claim 2, wherein the first current mirror circuit comprises:
   a first PMOS transistor including a first terminal connected to the power supply terminal, and a control terminal and a second terminal commonly connected to the second terminal of the compensation transistor; and
   a second PMOS transistor including a first terminal connected to the power supply terminal, a control terminal connected to the control terminal of the first PMOS transistor, and a second terminal generating the limited current.

13. The semiconductor device according to claim 12, wherein the first and second PMOS transistors have the same size with each other.

14. The semiconductor device according to claim 1, comprising:
   a charge pump circuit that boosts the power supply voltage, generates the drive signal, and supplies the drive signal to the drive signal input terminal; and
   a charge pump activation control circuit that outputs a charge pump activation control signal to instruct the charge pump circuit to start generation of the drive signal based on a voltage of the control terminal of the output transistor.

15. The semiconductor device according to claim 14, comprising a reverse-current prevention element that prevents a reverse current from flowing into a limited current output terminal that outputs the limited current in the limited current generation circuit.

16. The semiconductor device according to claim 15, wherein the reverse-current prevention element is polysilicon diode.

17. The semiconductor device according to claim 1, wherein the first terminal is a drain terminal, the second terminal is a source terminal, and the control terminal is a gate terminal.

18. The semiconductor device according to claim 1, wherein the output transistor and the detection transistor are vertical NMOS transistors.

* * * * *